United States Patent [19]

Orne

[11] 4,438,410

[45] Mar. 20, 1984

[54] VARIABLE GAIN AMPLIFIER

[76] Inventor: Laurence E. Orne, 4 Eubar Cir., Billerica, Mass. 01821

[21] Appl. No.: 306,844

[22] Filed: Sep. 29, 1981

[51] Int. Cl.³ .......................... H03G 3/18; H03C 1/26
[52] U.S. Cl. ..................................... 330/278; 330/149
[58] Field of Search ................ 330/278, 281, 279, 149

[56] References Cited

U.S. PATENT DOCUMENTS 3,714,598  1/1973  Wakai et al. .......................... 330/278
3,725,805  4/1973  Orne ..................................... 330/136

*Primary Examiner*—James B. Mullins
*Assistant Examiner*—Gene Wan
*Attorney, Agent, or Firm*—Donald J. Singer; William Stepanishen

[57] ABSTRACT

A variable gain amplifier apparatus utilizing an amplifier in conjunction with a signal detector and a charge storage device to establish a DC bias voltage which controls the threshold level of the input signal amplifier to maintain a constant input/output signal ratio over a wide dynamic range of the input signal.

3 Claims, 1 Drawing Figure

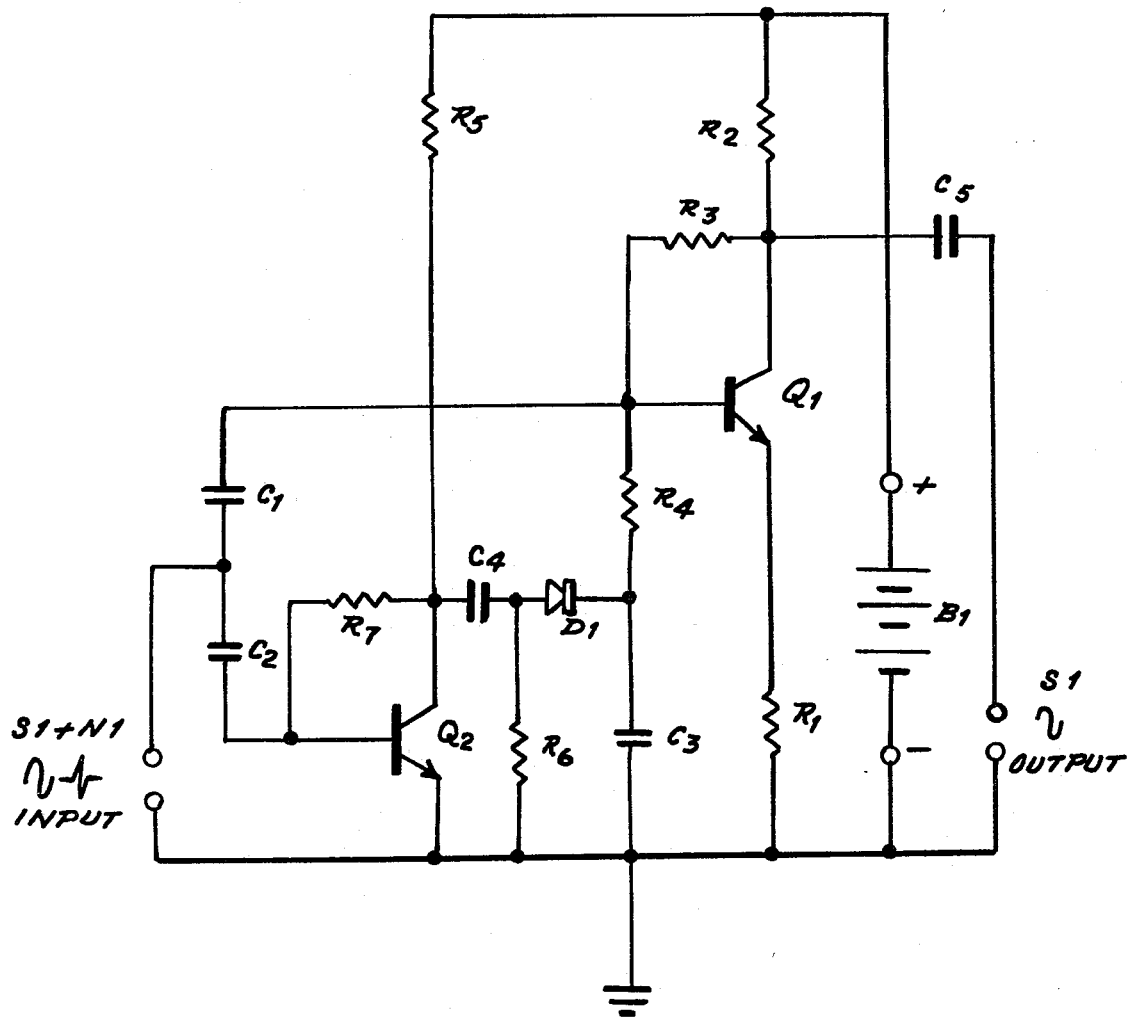

VARIABLE GAIN AMPLIFIER

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to an amplifier apparatus, and in particular to a variable gain amplifier apparatus.

There are a number of undesirable conditions that may occur in amplifiers, produced by improper circuit design and by inherent limitations in the physical operation of the devices. In general, good circuit design can reduce all of the undesirable conditions, including those caused by physical limitations to the point where they are not noticeable.

If the output signal from an amplifier is not an exact replica of the input signal, distortion has occurred. In theory it is impossible for an amplifier to avoid introducing distortion. On the other hand, amplifiers have been designed in which the distortion is extremely small. Distortion is introduced by two factors in the amplifier. One factor is a nonlinear relation of the device between the input signal and the output signal. If the input signal is a sinusoidal signal, the output will be composed of harmonies of the input. The second factor is the frequency response of the amplifier. Since the gain of the amplifier is not the same for all frequencies, the amplification of each harmonic component of an input signal is not necessarily the same as that of the others. The output signal, since it is a superposition of the harmonic components, differs from the input signal. Distortion caused by nonlinearities in the amplifier and by the frequency response of the amplifier can be reduced by the proper use of feedback.

The noise encountered in amplifiers may in general, be classified into thermal noise and shot noise. Thermal noise is caused by the random motion of electrons inside resistors, conductors, tubes, and transistors. It has the characteristic of having uniform power per unit bandwidth. Furthermore, the noise power is directly proportional to the temperature when expressed in degrees Kelvin. Shot noise is the name given to the noise generated in transistors or vacuum tubes by the random emission of holes or electrons from the emitter or cathode. The random emission produces minute fluctuations in the average value of collector or plate current. These fluctuations produce a small noise voltage of the same order of magnitude as thermal noise (a few microvolts).

To analyze the effect of these noise sources upon the circuit and to design the optimum circuit, noise generators are used, and the analysis proceeds in a straightforward manner. Although noise voltages can become bothersome in audio amplifiers, the most common situation where they must be considered is the design of rf amplifiers, where quite often the signal to be amplified is not much larger than the rms value of the noise voltage.

SUMMARY OF THE INVENTION

The present invention utilizes a first transistor amplifier to control the threshold level of a second transistor amplifier which is amplifying the input signal. The first transistor amplifier varies the threshold bias voltage at the second transistor amplifier in accordance with the variation in the input signal. The gain of the second transistor amplifier is thus gated to provide a constant ratio of input/output signal potential and a low distortion output over a wide dynamic range of signal input. The voltage output of the gated second transistor amplifier is reduced when residual noise and or a noise pulse is present in the input circuit.

It is one object of the present invention, therefore, to provide an improved variable gain amplifier apparatus.

It is another object of the invention to provide an improved variable gain amplifier apparatus which maintains a constant ratio of input/output signal potential over a wide dynamic range of the signal input.

It is still another object of the invention to provide an improved variable gain amplifier apparatus which maintains a low distortion output of the amplified signal over a wide dynamic range of the signal input.

It is yet another object of the invention to provide an improved variable gain amplifier apparatus wherein the voltage output of the gated amplifier is reduced residual noise and noise pulse conditions.

These and other advantages, objects and features of the invention will become more apparent after considering the following description taken in conjunction with the illustrative embodiment in the accompanying drawing.

BRIEF DESCRIPTION OF THE DRAWING

The sole FIGURE of the present invention is a schematic diagram of the preferred embodiment theory.

DETAILED DESCRIPTION OF THE PREFERRED EMBODIMENT

Referring now to the sole FIGURE of the invention, there is shown a schematic diagram of the variable gain amplifier apparatus. The input signal which comprise signal S1 and noise N1 are applied to the input terminals. One side of the input terminals is connected directly to ground while the other side is connected to the junction of capacitors C1, C2. The other end of capacitor C1 is connected directly to the base of transistor, Q1. The other end of capacitor C2 is connected directly to the base of transistor, Q2.

A threshold base dc bias voltage is applied to transistor Q1 by means of a high resistance R3 which is connected between the collector and base of transistor Q1 to provide an emitter current in transistor Q1 that is just below the collector circuit cutoff level. The emitter current in transistor Q1 is imited by an emitter resistor R1 that is connected between the emitter of transistor Q1 and ground G1. The collector of transistor Q1 includes a collector resistor R2 which allows the collector current to conduct during the period of the input signal S1 cycle. The resistor R2 terminates the collector of the transistor Q1 to a positive battery, B1. The dc signal S1 bias voltage is applied to the base circuit of transistor Q1 through resistor R4 during the charge time of capacitor C3. The capacitor C3 is charged during the input signal S1 cycle by the signal detector positive diode D1. The signal and noise (S1 and N1) amplifier transistor Q2 provides the amplified signal potentials which are to be rectified into dc voltages to charge capacitor C3 by means of the positive diode D1. The emitter of transistor Q2 is connected directly to a common ground G1. The collector circuit of transistor Q2 is terminated to the positive battery B1 by means of a high resistance value resistor R5. The base circuit of transistor Q2 receives a dc bias voltage through a resistor R7 which is connected to the collector of transistor Q2. A coupling capacitor C4 provides the amplified collector voltage output of transistor Q2 to the junction of the positive diode D1 and the resistor R6 which is connected to ground G1. The dc current in diode D1 is determined by the voltage drop across the resistor R6.

The output collector circuit of the gated transistor amplifier Q1 provides an output signal S1 potential via capacitor C5 and a common ground G1. The operation of the gated amplifier transistor Q1 maintains a constant ratio of input/output potential over a wide dynamic range of input signal S1 input, in conjunction with the charged cycle of capacitor C3 during the input signal S1 cycle.

The voltage output of the gated amplifier, transistor Q1 is reduced during residual nose and noise N1 pulse because the charge rate of capacitor C3 is very low, thus reducing the required dc bias voltage that is required for the base circuit of transistor Q1 during the noise N1 cycle. The noise pulse in the input signal has very little electrical energy with which to charge capacitor C3.

The variable gain amplifier comprises a first and second transistor amplifier, and a diode signal detector with a storage device to provide a threshold base bias potential level to the second transistor amplifier. The variable gain amplifier has a wide dynamic input signal range with an input/output signal voltage ratio of 2/1. At higher input signal voltages, the output of the amplifier approaches a linear ratio of 1/1. At very low signal input voltage levels, the output of the amplifier becomes a linear device with an input/output voltage ratio of 1/1. The signal storage device limits the lowest desired frequency of the input signal. The threshold bias voltage which is applied to the base of the gated transistor amplifier determines the input/output signal voltage ratio for the input signal that is being amplified.

Since the noise pulses in the input signal have very little potential energy to effect the amount of charge to be stored in the signal detector storage device and thereby reducing (by not increasing) the required base bias voltage of the second transistor amplifier, there is substantially no amplification of the noise signal. There is no change of emitter current, and the voltage drop across the collector load resistor of the transistor remains constant and the transistor remains in a near cut off mode of operation.

The signal detector receives signal and noise input potentials from the first transistor voltage amplifier with a grounded emitter and a high gain collector circuit. The base circuit of the first transistor amplifier receives both signal and noise input potentials via the coupling capacitor. The operating base bias potential of the first transistor amplifier is low thus reducing the signal detector output when there is no input signals and noise voltage inputs are present. Residual system noise will not be amplified.

Although the invention has been described with reference to a particular embodiment, it will be understood to those skilled in the art that the invention is capable of a variety of alternative embodiments within the spirit and scope of the appended claims.

What is claimed is:

1. A variable gain amplifier apparatus comprising in combination:

a first and second transistor amplifier means to receive an input signal, said input signal comprising an AC input signal and a noise signal, said first and second transistor amplifier means respectively having an input terminal, said input terminal of said first transistor amplifier means being connected to said input terminal of said second transistor amplifier means by a first and second capacitor, the common junction of said first and second capacitor forming an input terminal, said input signal being applied to said input terminal, a signal detector means connected to the output of said second transistor amplifier means, said second transistor amplifier means amplifying said input signal to provide an amplified output signal, said signal detector means receiving said amplified output signal from said second transistor amplifier means, said signal detector means rectifying said amplified output signal to provide DC voltages in response thereto, a charge storage means connected to said signal detector means to receive said DC voltages, said charge storage means storing said DC voltage to provide a DC bias voltage to the input of said first transistor amplifier means, said DC bias voltage varying directly with said input signal, said first transistor amplifier means providing an output voltage in response to said input signal and said DC bias voltage, said first transistor amplifier means maintaining a constant input/output signal ratio over a wide dynamic range of said input signal.

2. A variable gain amplifier apparatus as defined in claim 1 wherein said signal detector means comprises a positive diode.

3. A variable gain amplifier apparatus as defined in claim 1 wherein said charge storage means comprises a capacitor connected between the input of said first transistor and ground.

* * * * *